United States Patent [19]

Takata et al.

[11] Patent Number: 5,737,260

[45] Date of Patent: Apr. 7, 1998

[54] DUAL MODE FERROELECTRIC MEMORY REFERENCE SCHEME

[75] Inventors: Hidekazu Takata, Nara, Japan; Thomas Mnich, Woodland Park, Colo.; David Novosel, New Wilmington, Pa.

[73] Assignee: Sharp Kabushiki Kaisha, Japan

[21] Appl. No.: 626,614

[22] Filed: Mar. 27, 1996

[51] Int. Cl.⁶ .................................................. G11C 7/00
[52] U.S. Cl. .................... 365/145; 365/149; 365/203; 365/205; 365/210; 365/189.29; 365/230.03
[58] Field of Search ............................ 365/145, 149, 365/203, 205, 210, 189.09, 230.03

[56] References Cited

U.S. PATENT DOCUMENTS

| | | | |
|---|---|---|---|
| 5,218,566 | 6/1993 | Papaliolios . | |
| 5,381,364 | 1/1995 | Chern et al. | 365/145 |
| 5,392,234 | 2/1995 | Hirano et al. | 365/145 |
| 5,430,671 | 7/1995 | Hirano et al. | 365/190 |
| 5,434,811 | 7/1995 | Evans et al. | 365/145 |
| 5,467,302 | 11/1995 | Hirano et al. | 364/145 |
| 5,572,459 | 11/1996 | Wilson et al. | 365/205 |
| 5,592,411 | 1/1997 | Tai | 365/145 |
| 5,621,680 | 4/1997 | Newman et al. | 365/210 |

*Primary Examiner*—Joseph E. Clawson, Jr.
*Attorney, Agent, or Firm*—Morrison & Foerster, LLP

[57] ABSTRACT

A reference scheme for a Dynamic Shadow Random Access Memory which provides a reference voltage circuit used for determining the data state of a ferroelectric memory cell operating in either dynamic (DRAM) or nonvolatile (NVRAM) modes. The reference voltage circuit includes two ferroelectric capacitors with associated data state setting transistors such that in either DRAM or NVRAM operating mode, the two capacitors store opposite data states. The circuit also includes means for alternating the data state of each capacitor. In operation, the ferroelectric capacitors are discharged to associated bitlines producing voltages which are averaged to derive a half-state reference voltage level. The reference voltage is used to determine the state of an associated memory cell. Additionally, a ferroelectric memory circuit is provided which includes an array of reference voltage circuits configured and operated in a manner to reduce the fatigue and imprinting experienced by the reference capacitors.

27 Claims, 6 Drawing Sheets

DUAL MODE FERROELECTRIC MEMORY REFERENCE SCHEME

FIELD OF THE INVENTION

The present invention generally relates to ferroelectric memory circuits and, more particularly, to reference voltage generation circuits utilized in ferroelectric memory circuits for determining the data state of ferroelectric memory cells.

BACKGROUND OF THE INVENTION

In dynamic random access memory (DRAM) devices, a memory cell consists of a capacitor and a transistor (preferably a MOSFET) connected in series, referred to as a single-transistor, single-capacitor memory cell. One plate of the capacitor is connected to a fixed voltage, and the other plate is connected to the transistor's source terminal. The drain terminal of the transistor is connected to a bit line which is commonly coupled to many selection transistors of other memory cells. The capacitor is either charged to a selected voltage, representing a binary 1 data state, or is discharged to 0 volts, representing a binary 0 data state. The data (i.e., "1" or "0") is accessed (i.e., read or written) by using the transistor as a switch. When the transistor's gate is switched high, the charge on the capacitor is transferred through the transistor onto another capacitor on the bitline. To detect the bitline capacitor voltage (i.e., the level of the stored state), a reference voltage is used as a second input to a comparator, the comparator's first input being the bitline of interest. Typically, the reference voltage is chosen to be one half the difference between the voltages produced by the memory cell in its charged state and discharged state. This type of reference voltage is called a half-signal voltage. The most common method to create a half-signal voltage is to discharge a memory cell capacitor across two bitline capacitors, which results in each bitline capacitor being charged to one half the voltage of the charged cell capacitor.

Because of the ability to store memory values in a nonvolatile manner, ferroelectric components, and particularly ferroelectric capacitors, are highly advantageous in the realm of computer memory devices. Ferroelectric capacitors have two modes of storing data. The first mode is the same as that used in DRAM as discussed above. In this DRAM mode, the electric charge representing the binary data is stored as a voltage across the plates of a capacitor. The second mode occurs when supply voltage is lost. In this nonvolatile (formally referred to as NVRAM) form of memory storage, an electronic charge is trapped within the dielectric layer of the ferroelectric capacitor.

Such ferroelectric capacitors are ideal for use With Dynamic Shadow RAM (DSRAM), a dual mode memory which functions both as a DRAM and as a NVRAM. A memory device having a memory cell structure which employs ferroelectric capacitors is capable of providing such dual mode memory. As mentioned above, the ferroelectric capacitor has the capability to operate in a DRAM mode during normal operation of the memory cell and to operate in a NVRAM mode when power is removed. In either mode, a reference voltage is needed to provide a second input to a comparator for determining the state of the memory cell. A corresponding reference cell must be capable of providing two reference levels, representing data 1 and data 0 memory states, for each of the two modes of operation.

During DRAM operation, the reference cell stores a bias charge as a voltage on the ferroelectric reference capacitor, while in NVRAM operation, the reference cell stores a polarization charge within the dielectric layer of the same capacitor. To detect the state of the Dynamic Shadow RAM in DRAM mode, the sensing operation is identical to the conventional DRAM operation as described above. In NVRAM operation, the state of the memory cell is sensed by transferring the polarization charge of the reference cells onto the reference bitline capacitance. This charge creates an expected voltage on the bitline if a charge is stored (e.g., data 1 memory state) in the reference cell, or causes minimal to no voltage change if there is no charge stored (e.g., data 0 memory state) within the capacitor. The bitline provides a midpoint voltage equal to half the polarization charge to allow correct sensing of the two memory states.

Despite their versatility, ferroelectric capacitors are known to undergo changes in their electrical characteristics, especially during nonvolatile storage applications. In particular, the magnitude of the polarization charge gradually degrades as it ages. The magnitude also degrades as the number of polarization state changes increase as a result of writing to the memory cell With different data. This fatigue phenomena is compounded considering that the same reference cells are used for several hundred or thousand memory cell rows. In view of the fact that the voltages of small ferroelectric capacitors are on the order of millivolts, even a slight change in magnitude of the polarization charge can have a significant effect on the reliability of polarization determinations and, thus, on the accuracy in sensing the state of a memory cell.

In order to reduce the amount of degradation in a polarization charge, known prior art memory devices, such as described in U.S. Pat. No. 5,218,566, employ a pair of reference ferroelectric capacitors to generate a reference voltage. During nonvolatile operation, one of the reference capacitors stores one polarization state while the other stores the opposite polarization state. The electrical charges developed as a result of discharging the reference capacitors generate respective voltages across sensing capacitances. These voltages are averaged, by means of short circuiting the voltages together, to develop a reference voltage having a value which is intermediate the two polarization states of the reference capacitors. When such a reference circuit is employed in connection with a ferroelectric memory cell, the reference capacitors are addressed each time an associated data word in the memory cell is addressed. In this way, the ferroelectric characteristics of the reference cell capacitors, and thus the reference voltage, attempt to change according to the short-term variances in the characteristics of the memory cell capacitors.

However, because the reference capacitors of this prior art reference cell scheme are addressed each time an associated data word in the memory cell is addressed, the reference capacitors become fatigued and degrade much more quickly than the average memory cell capacitor. In addition, this scheme does not compensate for the likelihood of "imprinting" a particular data state into a reference capacitor. Imprinting is the term used to characterize the phenomena experienced by ferroelectric capacitors which develop a preference for remaining in a particular polarized state after being continually polarized in that state. Another drawback, discussed in more detail below, of conventional reference schemes when used in conventional memory array configurations, is that they loose their ability to accurately duplicate the state of associated memory cells.

Accordingly, there is a need for a reference scheme which reduces the amount of fatigue and imprinting experienced by ferroelectric reference capacitors. Moreover, there is a need for an improved reference circuit which can provide a reference voltage for a Dynamic Shadow RAM during both DRAM and NVRAM modes of operation. A corollary need exists for such a reference circuit which utilizes the same reference cells for both DRAM and NVRAM modes of operation. There is also a need for an improved ferroelectric memory architecture in which the ferroelectric reference cells more accurately duplicate the state of associated ferroelectric memory cells.

SUMMARY OF THE INVENTION

The present invention provides for a reference scheme for DSRAM. The reference scheme utilizes a reference voltage circuit for determining the binary data state of a ferroelectric capacitor in both DRAM and NVRAM operating modes. The reference voltage circuit includes a pair of oppositely charged reference cells to generate a reference voltage, wherein each cell includes a ferroelectric capacitor with associated data state setting transistors such that, in either DRAM or NVRAM operating mode, the two capacitors store opposite data states. The two cells of a reference cell pair can be alternately preset to opposite states after each data transfer (read/write) cycle to reduce the fatigue rate of and the likelihood of imprint upon the reference cell capacitors.

The present invention also provides for a method for generating a reference voltage for a ferroelectric memory circuit operating in either DRAM mode or NVRAM mode. The method involves storing opposite charges on a pair of ferroelectric capacitors, discharging each ferroelectric capacitor into a respective sense capacitance where the sense capacitances are charged to a corresponding voltage, deriving a reference voltage which is the average of the corresponding voltages of the sense capacitances, and alternating the charges on the pair of ferroelectric capacitors wherein the respective charge on each ferroelectric capacitor is opposite to the charge initially stored.

According to another aspect of the present invention, a memory circuit is provided which employs the dual mode reference scheme described above and has a configuration which serves to reduce the amount of fatigue and imprinting experienced by a reference cell. The memory circuit includes an array of ferroelectric memory cells in which each array includes a plurality of pairs of rows of ferroelectric memory cells. A memory bitline is connected to each row of memory cells, and a sense amplifier and at least one reference circuit are associated with each pair of rows, wherein when one of the rows of a pair of rows is accessed during a data transfer cycle, the associated reference circuit is also accessed. Each reference circuit is defined by a pair of reference cells each of which has a reference bitline and a sense capacitance associated therewith. A means is provided for short circuiting the reference bitlines of each pair of reference cells to obtain an average of the voltages developed across the associated sense capacitances. With this configuration, when one row of each row pair is selected, the other row in the pair is not selected and the memory bitline of the unselected row is then useable as a conductor for coupling the average voltage to the associated sense amplifier.

Yet another ferroelectric memory circuit according to the present invention is provided which further reduces the fatigue and imprinting endured by a reference cell. This memory circuit is similar to that described above but employs two reference circuits per memory cell row. Additionally, in accordance with the present invention, methods are provided for operating these memory circuits.

DETAILED DESCRIPTION OF THE INVENTION

Figure 1:
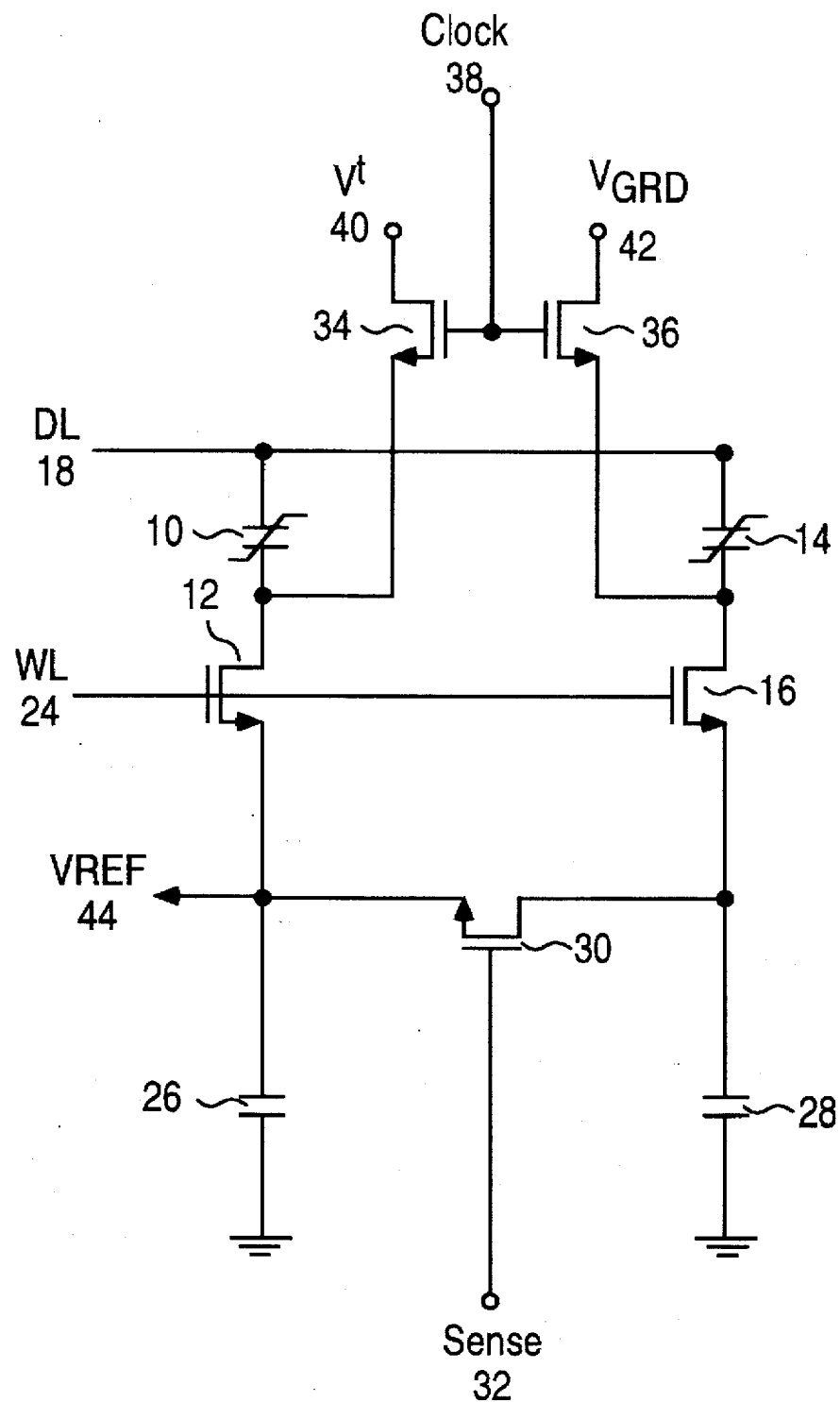
FIG. 1 is a schematic diagram of a conventional reference voltage circuit.

Reference is now made to the drawings, in which like reference numbers identify like elements. Referring particularly to FIG. 1, there is illustrated a conventional reference circuit comprised generally of a complementary cell pair having a first reference ferroelectric capacitor 10 and associated select transistor 12, and a second reference ferroelectric capacitor 14 and an associated select transistor 16. Ferroelectric capacitors 10 and 14 are typically the same size. The top plate of each ferroelectric capacitor 10 and 14 is connected to a drive line 18, while each ferroelectric capacitor is connected by way of its associated select transistor to a different bitline 20 and 22. The select transistors 12 and 16 are driven by a common word line 24. The complimentary bit lines 20 and 22 are connected to one plate of respective discrete or parasitic sense capacitances 26 and 28, with the other respective plates of the capacitors being grounded. A transistor 30 is connected between the complementary bitlines 20 and 22 to provide a short circuit therebetween in response to a signal provided by a sense circuit 32 (not shown in detail). The bottom plate of the respective reference capacitors 10 and 20 are connected to respective reset transistors 34 and 36, which are driven by a common timing circuit 38. The source of transistor 34 is connected to a fixed voltage (V+) 40 while the source of transistor 36 is connected to a ground reference ($V_{GRD}$) 42. With this configuration, reference capacitors 10 and 14 are oppositely charged or polarized, first reference capacitor 10 being positively charged and second reference capacitor 14 being negatively charged.

In operation, upon a read cycle, voltages are applied to word line 24 and drive line 18. Reference capacitors 10 and 14, being coupled to bitlines 20 and 22, will transfer or discharge the respective electrical charges thereto. As a result, sense capacitors 26 and 28 become charged, having positive and negative voltages, respectively, based on the charge provided by reset transistors 34 and 36. A sense signal sends transistor 30 into conduction causing a short circuit between bitlines 20 and 22. The charge on the sense capacitors 26 and 28 equalizes and a reference voltage is then established at the $V_{ref}$ output 40. $V_{ref}$ is midway between the magnitude of the voltages between sense capacitors 26 and 28. After the read cycle, reference capacitors 10 and 12 are rewritten, by means of circuitry 38, to their respective charged states. Since only reference capacitor 10 experiences such a fatigue cycle, it wears at a much faster rate than reference capacitor 12 which is set with the ground reference.

Figure 2:
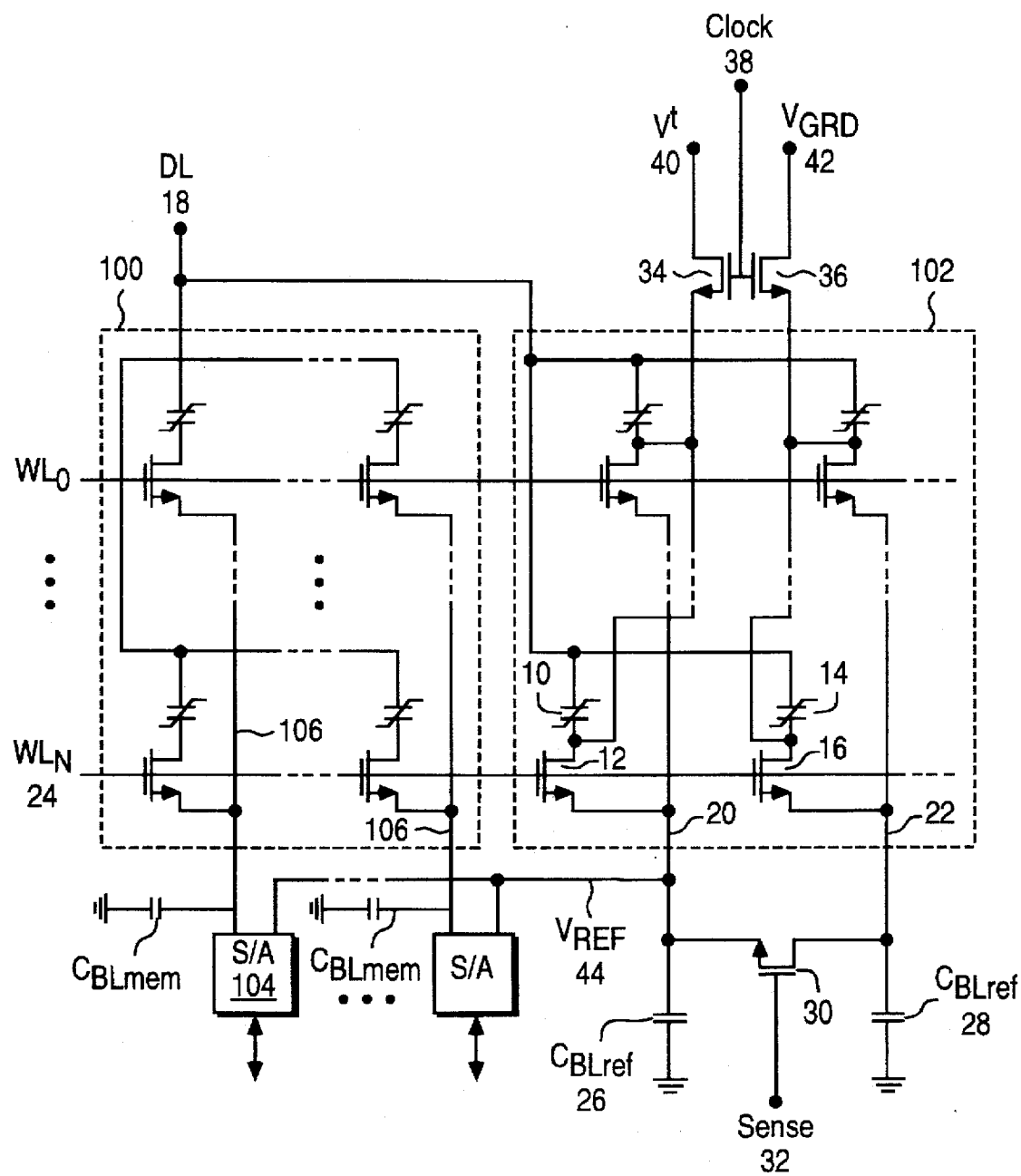
FIG. 2 is a block diagram of a conventional memory architecture employing the reference voltage circuit of FIG. 1.

FIG. 2 illustrates a conventional memory architecture employing the reference circuit of FIG. 1. The memory includes a memory array 100 (and may include a plurality of memory arrays) and reference array 102 which are similarly constructed single-transistor, single-capacitor cells. Each cell in memory array 100 represents a bit where each horizontal row of memory cells represents a multiple bit data word. Each addressable data word, i.e., a single row of memory cells, of array 100 is driven by a selected one of a number of word lines ($W_{L0}$–$W_{LN}$) 24. For each independently addressable data word, there is a corresponding reference cell in reference array 102. A drive line 18 and a word line 24 operate in conjunction to access a single row of memory cells and the corresponding row of reference cells. For each column of memory cells in memory array 100 there is associated one sense amplifier in a set of sense amplifiers 104. Each sense amplifier 104 has two inputs, one input connected to an associated memory cell bit line ($C_{BLmem}$) 106 and the other input connected to the reference voltage line ($V_{ref}$) 44 to receive a reference voltage generated by the particular reference cell pair associated with the memory row accessed. Sense amplifiers 104 sense the memory state of the associated memory cells by comparing the voltage across the respective memory cell bitlines 106 to the midpoint reference voltage 44.

With the configuration of memory and reference arrays and associated sense amplifiers described in conjunction with FIG. 2, it is important to note that all sense amplifiers of set 104 are used each time a particular word line is activated. This is because each sense amplifier 104 is associated with a column of memory cells rather than with a memory cell row which holds an addressable data word. When a memory cell row is accessed, the reference voltage must be bussed through a plurality of sense amplifiers in order that the memory state of each memory cell in the memory cell row is properly sensed. Consequently, the capacitances ($C_{BLmem}$) of the various memory bitline inputs 106 will be less than the capacitances ($C_{BLref}$) of the associated reference bitline inputs 26, 28. As a result, a reference cell cannot match the memory state of the associated memory cell.

Figure 3:
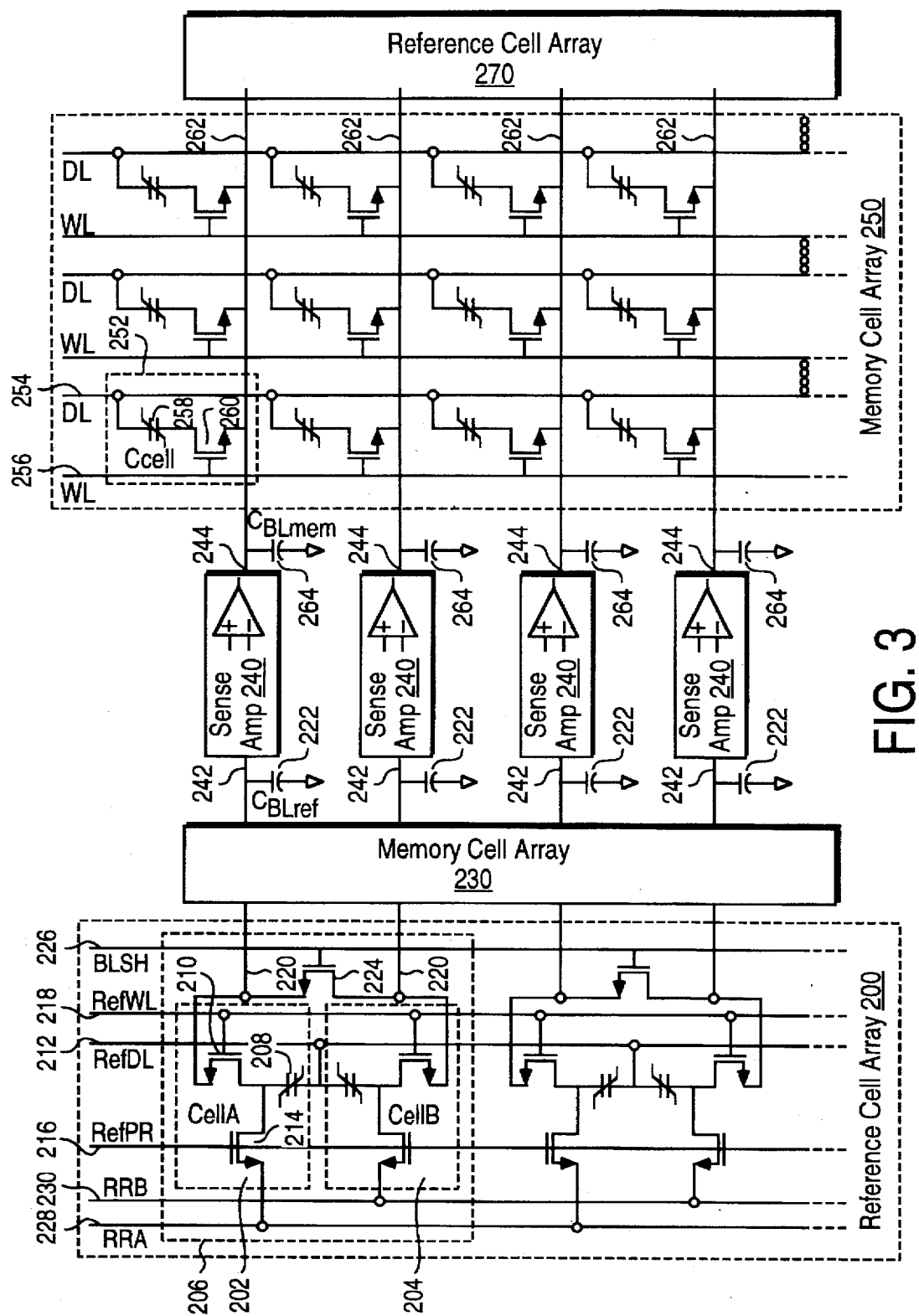
FIG. 3 is a block diagram of a memory architecture of the present invention for use with an open bitline memory array.

Referring now to FIG. 3, there is illustrated a schematic representation of a memory architecture according to the present invention which employs an open bitline configuration. The memory includes, from left to right, a first reference cell array 200, a second memory cell array 230, a set of sense amps 240, a first memory cell array 250, and a second reference cell array 270. With this configuration, first reference cell array 200 operates in tandem with first memory cell array 250 and, similarly, second reference cell array 270 operates in tandem with second memory cell array 230. It is important to note that when the first memory cell array 230 is being accessed, the second memory cell array 250 is inactive, and visa versa. This configuration allows the respective inactive memory cell bitlines to be used by the active reference cell array to provide the reference voltage input to the sense amplifiers 240. The operation of the memory architecture is discussed in more detail below with respect to FIGS. 5 and 6. A detailed description of the memory architecture is now provided.

For purposes of this discussion, only the details of the components of the first reference cell array 200 and the second memory cell array 250 are illustrated and described; however, it should be assumed that the circuitry of the other reference cell array 270 and memory cell array 230 are similar to their respective counterparts. Memory cell array 250, the configuration of which is known in the relevant art, is constructed of a plurality of single-transistor, single-capacitor memory cells 252 wherein each column of memory cells is accessed simultaneously as a multiple bit data word. The capacitors and transistors of each memory cell 252 are comprised of ferroelectric materials and have equivalent sizes and operating parameters. Each memory cell 252 stores the binary state (data 0 or data 1) of a bit of a stored data word. A drive line 254 and a word line 256 operate in conjunction to access a single row of memory cells 252. When drive line 254 and word line 256 are activated, the charge on the capacitor ($C_{CELL}$) 258 of an individual memory cell 252, is transferred via an associated select transistor 260 to the memory cell bitline capacitor ($C_{BLmem}$) 264 of the associated memory cell bitline 262. The top plate of memory cell bitline capacitor 264 is connected to one of the two inputs to sense amp 240 and the bottom plate of capacitor 264 is grounded.

A particular memory cell bitline 262 in memory cell array 250 is associated with each memory cell in a row of memory cells. For each bitline 262, and thus for each row of memory cells 252, in memory array 250 there is an associated reference cell, such as reference cell A 202, in reference cell array 200. Reference circuit 206 includes a pair of reference cells, cell A 202 and cell B 204, each having a reference ferroelectric capacitor 208 and an associated select transistor 210 (only the components of cell A are identified with reference numbers). The capacitors 208 are preferably of the same dimensions and the transistors 210 are also preferably of the same dimensions. Additionally, these ferroelectric capacitors 208 and select transistors 210 of cell pair 206 preferably have the same dimensions as those capacitors 258 and transistors 260 used in memory cell array 250.

The top plate of each ferroelectric capacitor 208 is connected to a reference drive line 212, and the bottom plate of each is connected to a reference reset transistor 214. Select transistors 210 are driven by a common reference word line (RefWL) 218. Each reference capacitor 208 is connected by way of its associated select transistor 210 to an associated reference bitline 220 having a reference bitline capacitor ($C_{BLref}$) 222. These bitlines 220 are coupled through to reference bitline capacitors 222 via the bitlines of memory cell array 230, which are inactive upon operation of memory cell array 250 and reference cell array 200. The top plate of capacitors 222 are connect to an input of associated sense amplifiers 240 and the other plate of capacitors 222 are connected to ground. A bitline shunt or shorting transistor 224 is connected between the two reference bitlines 220 of a reference cell pair 206 to provide a short circuit therebetween in response to a bitline shorting signal (BLSH) 226. The bottom plate of the respective reference capacitors 208 are connected to the drain terminals of respective reset transistors 214. The source terminals of reset transistors 214 of cells A and B are connected to reference reset signals (RRA) 228 and (RRB) 230, respectively, for setting the bias charges (in DRAM mode operation) or polarization charges (in NVRAM mode operation) of reference capacitors 208. The operation of reference reset transistors 214 are driven by means of a common reference preset signal (RefPR) 216 coupled to the gate terminal of each reset transistor 214. The RRA and RRB signals are always at opposite voltages, i.e., when RRA is positive, RRB is negative, and visa versa.

In operation, for both DRAM and NVRAM operating modes, reference circuit 206 provides a midpoint reference voltage by duplicating the charge on the memory cell bitline capacitor $C_{BLmem}$ 264 which represents either a data 0 (Q0) or a data 1 (Q1). The voltage on each reference bitline 220 is represented by either Q0/($C_{BLref}$+$C_{CELL}$) or Q1/($C_{BLref}$+

$C_{CELL}$) depending upon the data state of the respective reference cell. $C_{BLref}$ is the capacitance 222 of the respective reference cell bitline 220, $C_{CELL}$ is the capacitance load of the respective memory cell and reference cell capacitors 252, 208, and Q0 and Q1 is the charge on the respective reference capacitor 208. The desired reference voltage is that voltage midway between the magnitudes of the voltages on the reference bitlines 220 corresponding to each reference cell pair 206. Since cell A and cell B are preset such that one holds a data 1 memory state and the other holds a data 0 memory state, the reference voltage is represented by (Q1+Q0)/2*($C_{BLref}$+$C_{CELL}$). The method of obtaining this desired reference voltage is now described.

As mentioned above, in order to accurately reproduce the reference bitline capacitances ($C_{BLref}$) needed to generate the proper reference voltage (i.e., the voltage on reference bitlines 220) to sense amplifier 240, the memory of the present invention is configured to use the unselected or inactive bitlines of the memory (memory cell array 230 in the example depicted in FIG. 3) as reference voltage generating capacitive loads ($C_{BLref}$). As such, the selection of any data word address in memory cell array 250 activates a corresponding row of reference cells in reference cell array 200. Upon activation of reference word line 218 and reference drive line 212, the charge across reference capacitors 208 is transferred, respectively to reference bitline capacitances 222 through reference bitlines 220 and the inactive memory bitlines of memory cell array 230. Reference cells A and B are preset by operation of respective reset transistors 202 and RefPR signal 216 such that one holds a data 0 and the other holds a data 1. When the BLSH signal 226 is active, shorting transistor 224 turns on creating a short between reference bitlines 220. A voltage of (Q1+Q0)/2*($C_{BLref}$+$C_{CELL}$) volts is now provided on each of the reference cell's bitlines 220 and as the reference voltage at input 242 of sense amplifier 240. The memory bitline capacitor 264 provides the second input 244 to sense amplifier 240. After the charge transfer is complete, BLSH signal 226 goes inactive, turning off shorting transistor 224. This allows each sense amplifier 240 to independently detect the state of the respective memory cell 252 by comparing inputs 242 and 244.

The above described reference scheme of the present invention is operable in both DRAM and NVRAM modes. In the DRAM mode of operation, data 0 and data 1 memory states are represented as voltages stored across the plates of reference capacitors 208. In the NVRAM mode of operation, the data states are represented by the direction of polarization of the dielectric layer of reference capacitors 208. In both cases, reference cells A and B hold opposite states. In DRAM operation, one cell is charged while the other one is discharged. In NVRAM operation, the cells are oppositely polarized, one positive and one negative.

Figures 4, 5:
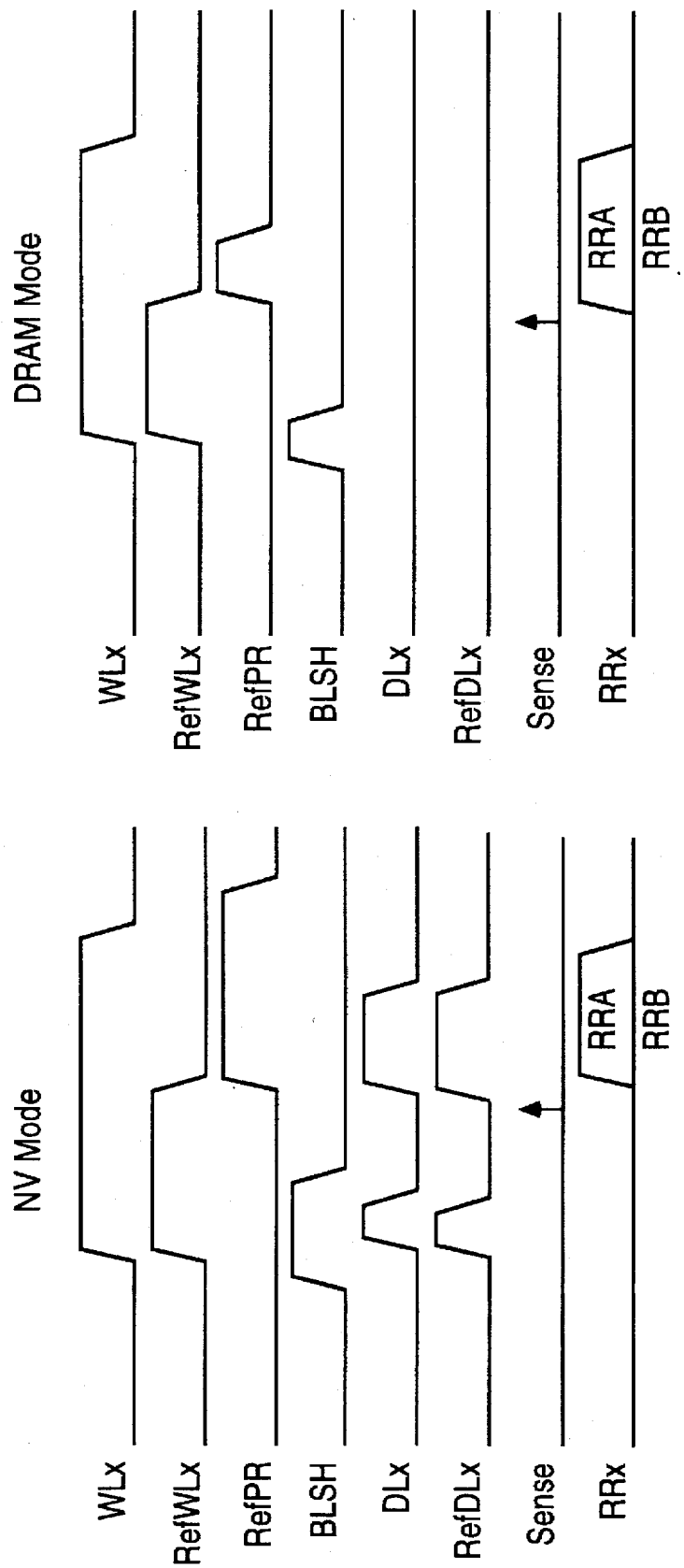
FIG. 4 is a timing diagram illustrating the memory cell and reference cell control signals for NVRAM mode operation of the ferroelectric reference voltage circuit of FIG. 3.
FIG. 5 is a timing diagram illustrating the memory cell and reference cell control signals for DRAM mode operation of the ferroelectric reference voltage circuit of FIG. 3.

Turning now to FIGS. 4 and 5, there are shown timing diagrams which represent the operating characteristics of the memory and reference cell control signals of the open bitline memory architecture of FIG. 3 when operating in NVRAM and DRAM modes, respectively. For the sake of brevity in the description that follows, reference is only made to read cycle operation, however, sensing occurs during both read and write cycles as writing to memory inherently involves, what is known as, a "destructive" read cycle.

In the example shown in FIG. 4 illustrating NVRAM operating characteristics, it is assumed that the cells are initially preset or polarized to opposite states. Upon a read cycle of a selected data word in the memory cell array, the selected memory cell word line (WLx) and the corresponding reference cell word line (RefWLx) become active. The BLSH signal then becomes active to short the two reference bitlines together to formulate the reference voltage. The selected memory cell drive line (DLx) and corresponding reference cell drive line (RefDLx) signals are pulsed in order that the states of the selected memory and associated reference cell capacitors are transferred to the memory and reference bitlines capacitances, respectively. A sense signal is then applied at which time the reference voltage is "sensed" or "read" by the sense amplifiers. After sensing, the selected RefWLx signal becomes inactive, completing the read cycle. At this point, the charge on the reference cell capacitors are reset by means of the RefPR signal becoming active. The respective reset transistors mm on, coupling the reference cell capacitors to the reference reset signals RRA and RRB. The selected memory cell drive line signal DLx and reference cell drive line signal RefDLx again become active to allow the reference reset signals RRA and RRB signals to provide a polarization voltage to the dielectric or internal plate of the respective reference cell capacitors to accomplish the desired polarization of each capacitor. With the bottom capacitor plate connected to the RefDLx signal and the top plate biased to either a defined positive voltage (i.e., Vcc, typically 3-5 volts) or zero volts according to the reference reset signals (RRA and RRB), the bottom plate is pulsed to the positive voltage and back to 0 volts. Due to the unique hysteresis characteristics of ferroelectric capacitors, the reference capacitor which was initially negatively polarized becomes positively polarized while the reference capacitor which was initially positively polarized remains positively polarized. The reference capacitor polarized in a positive state will transfer less electrical charge to its associated reference bitline than will the reference capacitor that switches polarization states (i.e., the one initially polarized with a negative polarization state). It is the difference in the magnitude of change in the electrical charge between the two reference capacitors that is sensed. The RRA and RRB signals are held in opposite data states during the RefDLx pulse in order to polarize the reference cells to "opposite" states. Before the RefPR signal becomes inactive to switch off the reset transistors, the RefDLx signal is removed from the bottom plate of the respective reference capacitors so that only a polarization charge, and not the bias charge (as in the DRAM mode), is transferred to the reference bitlines. It should be noted that, in the example of FIG. 4, the reference reset or preset operation takes place after the read operation; however, the reset/preset operation may take place prior to the read cycle.

FIG. 5 shows a similar timing diagram for DRAM mode operation. As with the example in FIG. 4, the reference cell capacitors are presumed to have been preset to opposite states. In addition, the read cycle is shown occurring prior to resetting the reference cell capacitors; however the reset operation may take place after the read operation. For DRAM mode operation, the selected drive line signal (DLx) in the memory cell array and the selected drive line signal (RefDLx) in the reference cell array are always held at the same voltage, in this case at ground, and not pulsed as during the NVRAM mode operation. Upon initiation of a read cycle for a selected data word in the memory cell array, the associated reference cell RefWLx signal becomes active causing the charge on the reference capacitors to be transferred to the respective reference cell bitline capacitances. At the same time, the BLSH signal goes active to couple the reference bitlines together to provide a reference voltage which is sensed by the sense amplifier upon activation of the sensing signal. After sensing, the RefWLx signal becomes inactive and the RefPR signal becomes active in preparation for resetting the state of the reference capacitors. Both reset transistors turn on, coupling the respective reset signals RRA and RRB, which in DRAM mode are bias voltages at either a fixed positive voltage or at zero volts, to the bottom plates of the reference capacitors. As RRA and RRB are always at opposite voltages, the reference cell capacitors are provided with opposite bias charges.

Preferably, the reference circuit of the present invention utilizes the same reference cells for generating a reference voltage for a DSRAM during both DRAM and NVRAM operation. Specifically, the reference cells provide a bias charge when in DRAM mode and a polarization charge when in NVRAM mode. The reference scheme of the present invention also provides for alternating the voltage levels on the RRA and RRB signal lines for every read cycle in both NVRAM and DRAM modes. Since only the reference cell which is set with the positive voltage (representing a data 1 state in the examples shown) experiences the fatigue cycle, the overall performance of the reference cell pair is improved by alternating the voltage levels on the reference reset signals. Thus, while RRA and RRB must always be at opposite voltage levels during the reference preset operation, their voltages are alternated for each read cycle thereby equally sharing the number of fatigue cycles between the two reference capacitors of a reference cell pair. Additionally, the likelihood of imprinting a particular data state on a reference cell is minimized by alternately polarizing the cell with opposite states.

Alternating the voltage levels of the reference reset signals is accomplished with the present invention by incorporating a means for the reference reset circuit to read the memory row address of the selected data word such that one of the reference reset signals is always at a positive voltage for half of the memory cell array (e.g., memory cell array 230 in FIG. 3) and zero volts for the other half of the memory cell array (e.g., memory cell array 250 in FIG. 3). When the memory row address changes from one half of the array to the other half, the reference reset voltage levels will switch. The fatigue experienced by a particular reference cell is reduced by half by using addresses to select which cell of each reference cell pair will be polarized or charge, and thus fatigued. Suitable circuitry and techniques for addressing are well known in the art.

Figure 6:
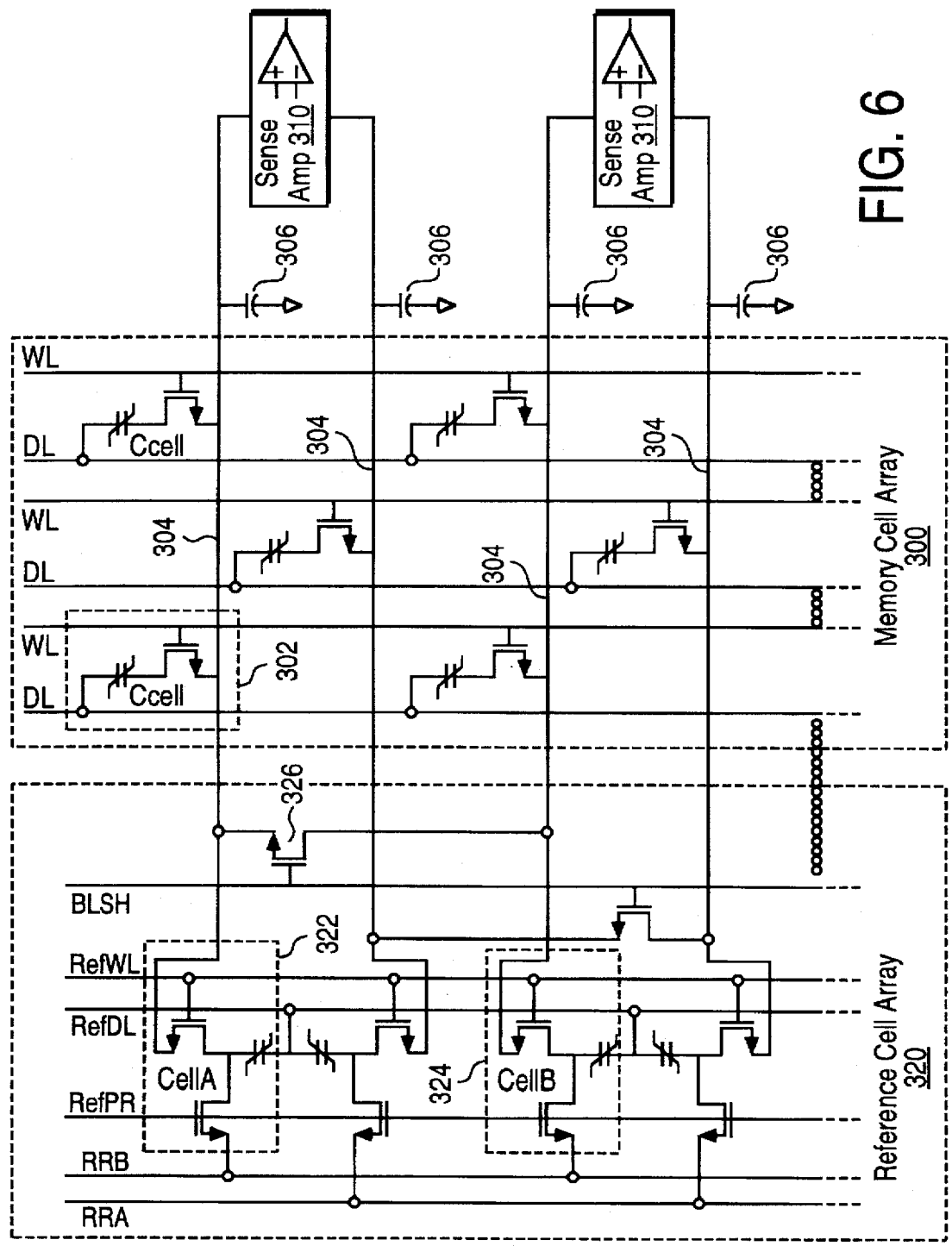
FIG. 6 is a block diagram of another memory architecture according to the present invention for use with a folded bitline memory array.

Although described in detail with respect to an open bitline memory array configuration, the advantages of the reference cell scheme of FIG. 3 and the dual-mode operating principles of the present invention described above can be realized with a folded bitline memory array configuration such as the one illustrated in FIG. 6. Folded bitline memory architectures are well known by those skilled in the art of memory circuit design.

The configuration of FIG. 6 includes a memory cell array 300 and a corresponding reference cell array 320. As shown schematically in FIG. 6, only every other memory cell space in each row and in each column of memory cell array 300 is utilized as a memory cell, forming a checker board pattern of useable memory cells 302. The individual memory cell structure is similar to that of the single-transistor, single-capacitor memory cells described with respect to FIG. 3. When a data word, represented by a single row of memory cells, is selected, alternating columns of memory cells are accessed simultaneously as a multiple bit data word. In other words, only memory cells in either even numbered columns or odd numbered columns in the memory array are selected during a given data transfer.

In FIG. 6, a memory cell bitline 304 in memory cell array 300 is associated with each memory cell 302b in a row of memory cells. For each bitline 304, and thus for each row of memory cells, in memory array 250 there is an associated reference cell, such as reference cell A 322, in reference cell array 320. The individual cell structure of reference cell array 320 is similar to that described with respect to the open bitline configuration of FIG. 3, however, the pairing of reference cells to form reference cell pairs is done differently in a folded bitline configuration. In the latter configuration, a particular reference cell is not paired with the reference cell associated with an adjacent bitline, but instead, is paired with a non-adjacent reference cell, such as reference cell B 324, which is associated with a non-adjacent bitline. The pairing of reference cells A and B (322, 324) and their associated bitlines 304 is controlled by a switching transistor 326. Again, the respective capacitors and transistors of the reference cell array 320 are preferably of the same dimensions as those used in memory cell array 300.

As with the open line bitline configuration of FIG. 3, the folded bitline configuration of FIG. 6 utilizes those memory bitlines 304 and associated bitline capacitances 306 of unselected memory rows in memory array 300 for providing a reference voltage input to a sense amplifier 310. However, unlike the open bitline configuration which utilizes memory cell bitlines of the inactive "half" of the memory, the inactive memory bitlines of the folded bitline configuration are of the same memory cell array as the active memory bitlines. In other words, both inputs of each sense amplifier 310 are provided by bitlines of the same memory array 300, one bitline providing a voltage representative of the charge of the associated memory cell and the other bitline providing a reference voltage generated by the associated reference cell pair.

All inventive aspects (e.g., such as alternating reset reference signals, application in both NVRAM and DRAM mode operation, etc.) discussed with respect to the open bitline configuration of FIG. 3, are realized by the folded bitline configuration.

Figure 7:
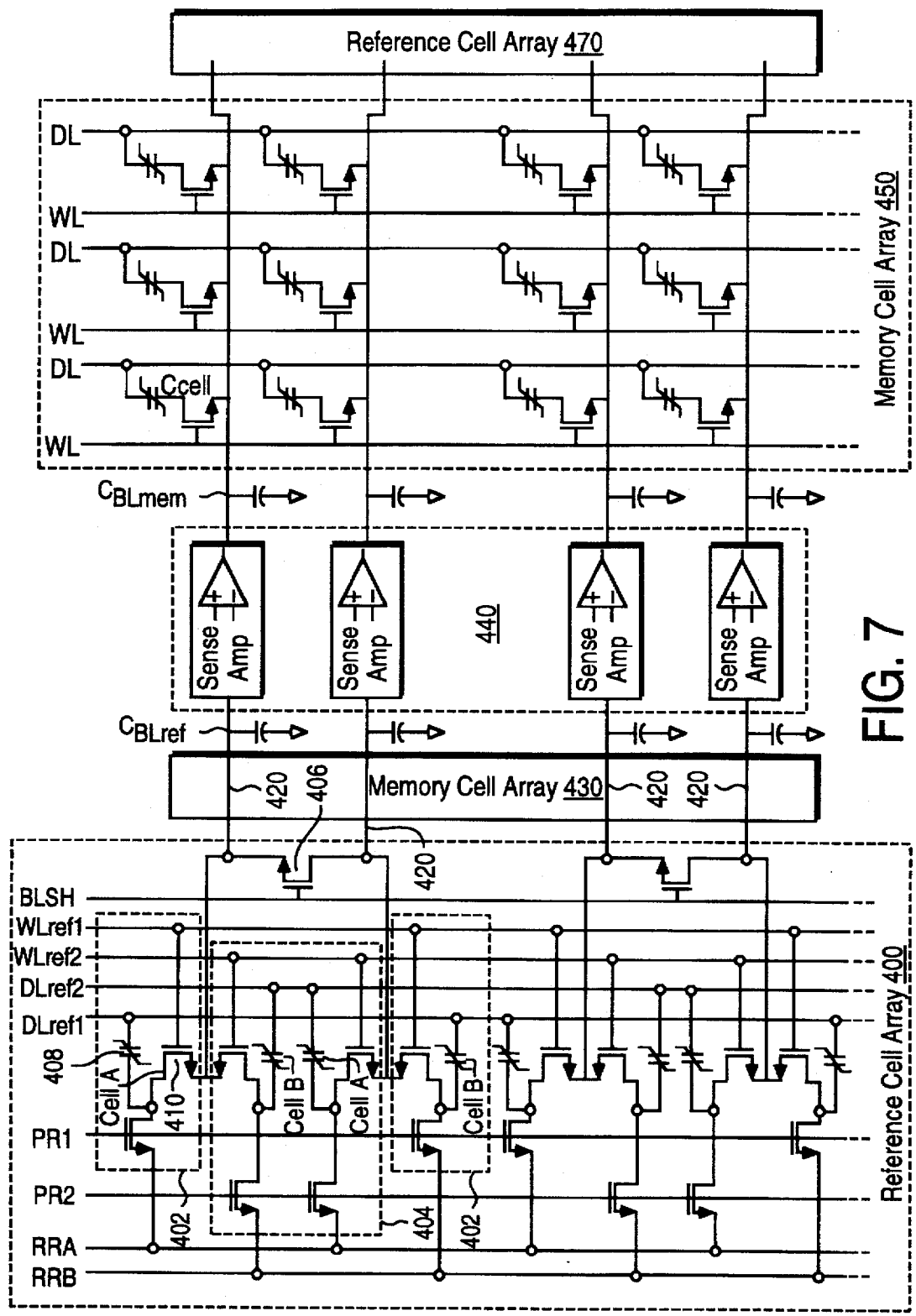
FIG. 7 is a block diagram of another memory architecture according to the present invention.

The fatigue and imprinting experienced by reference cells can be further reduced by employing multiple rows of reference cells, in both open and folded bitline configurations, to further reduce the number of fatigue cycles endured by each reference cell. For example, as shown in the open bitline memory configuration of FIG. 7, an additional row of reference cell pairs has been incorporated for each associated memory cell row. The memory configuration of FIG. 7 is similar to that of FIG. 3 and includes, from left to right, a first reference cell array 400, a second memory cell array 430, a set of sense amps 440, a first memory cell array 450, and a second reference cell array 470. As with the configuration of FIG. 3, first reference cell array 400 operates in tandem with first memory cell array 450 and, similarly, second reference cell array 470 operates in tandem with second memory cell array 430. When the first memory cell array 450 is being accessed, the second memory cell array 430 is inactive, and visa versa. This configuration allows the respective inactive memory cell bitlines to be used by the active reference cell array to provide the reference voltage input to the sense amplifiers 440 as previously discussed with respect to FIG. 3.

Unlike the embodiment of FIG. 3, however, associated with each reference bitline 420 are two pairs 402, 404 of reference cells rather than only one reference cell pair. Each pair 402, 404 has complimentary cells A and B which are similarly configured to those of FIG. 3, each having a ferroelectric capacitor 408 and select transistor 410. Associated with each reference cell pair 402, 404 is a separate word line (WLref1 or WLref2), drive line (DLref1 or DLref2), and reference preset signal (PR1 or PR2). However, common to both pairs of cells 402, 404 are a switching transistor 406 and reference reset signals RRA and RRB, where RRA provides a reset voltage signal to cell A within each reference cell pair and RRB provides a reset voltage signal to cell B within each reference cell pair. One side of switching transistor 406 is coupled to one select transistors 410 in each reference cell pair, and the other side of switching transistor 406 is coupled to the other two select transistors 410.

The row addressing technique described above for alternating the states of the reference reset signals RRA and RRB can also be used to alternate reference cell pairs 402, 404. During each read cycle, a first address is used to switch the data states of the reference reset signals RRA and RRB, and a second address is used to switch between reference cell pairs 402, 404. Thus, for each read cycle, one reference cell pair is active while the other reference cell pair is inactive. Consequently, the amount of fatigue and imprinting experienced by any given cell is again reduced by half. For example, consider a memory array of 256 rows in which, during any given read cycle, 128 rows is considered to contain data and the other 128 rows provides the reference voltage. If the cells in the rows used as references are always preset to the same state, the reference capacitors endure 128 times as many fatigue cycles as the average memory cell. According to the present invention, by employing row addressing to alternate the states of the two reference cells within a reference cell pair, the fatigue ratio for each reference cell is reduced by half to 64 times that endured by the average memory cell. Furthermore, by employing two rows of reference cells per memory cell row, the fatigue ratio is again reduced by a factor of two to 32 times that endured by the average memory cell. Of course, any number of reference cell rows may be used to further reduce fatiguing and imprinting; however, the more rows that are employed, the greater the amount of space required on a memory chip.

It is understood that the foregoing is only illustrative of principles of the present invention, and that various modifications may occur to persons skilled in the art which are within the scope and spirit of the invention. The above detailed description of particular embodiments of the present invention is not intended to limit the scope of the invention which is defined by the appended claims.

What is claimed:

1. A dual mode reference circuit for generating a reference voltage for use with a ferroelectric memory circuit operating in either DRAM mode or NVRAM mode, comprising:
   a pair of ferroelectric reference cells capable of storing opposite data states and wherein each said reference cell is capable of alternately storing opposite data states.

2. The dual mode reference circuit of claim 1 wherein each said reference cell comprises a ferroelectric capacitor having two plates and a ferroelectric material therebetween, wherein said ferroelectric capacitor stores a bias charge across said plates when said memory circuit is operating in DRAM mode and wherein said ferroelectric capacitor stores a polarization charge in said ferroelectric material when said memory circuit is operating in NVRAM mode.

3. The dual mode reference circuit of claim 2 further comprising a sense capacitance associated with each said reference cell, each said reference cell further comprising an associated select transistor effective to connect said ferroelectric capacitor in series with said associated sense capacitance wherein a charge representative of the data state stored by said ferroelectric capacitor is transferred to said associated sense capacitance.

4. The dual mode reference circuit of claim 3 further comprising a circuit for generating a voltage representative of the average of the charges across the two sense capacitance's associated with said at least one reference cell pair, said voltage defining said reference voltage.

5. The dual mode reference circuit of claim 1 further comprising means for setting said reference cells to opposite data states.

6. The dual mode reference circuit of claim 5 further comprising means for alternating the data state of each said reference cell at each data access cycle of said memory circuit.

7. The memory circuit of claim 6 wherein said means for setting comprises a reset transistor associated with each said reference cell.

8. The memory circuit of claim 7 wherein said means for alternating comprises means for detecting the address of an accessed data word.

9. A memory circuit, comprising:
   an array of ferroelectric memory cells, said array comprising a plurality of pairs of rows of ferroelectric memory cells;
   a memory bitline connected to each said row;
   a sense amplifier associated with each said row pair;
   at least one reference circuit associated with each said row pair, said at least one reference circuit defined by a pair of reference cells and having a reference bitline associated with each said reference cell, wherein when one of said rows of a row pair is selected during a data transfer cycle, said at least one associated reference circuit is also selected;
   a sense capacitance associated with each said reference bitline; and
   means for short-circuiting together the reference bitlines of each said pair of reference cells to obtain an average of the voltages developed across said associated sense capacitances;
   wherein when one row of each said row pair is selected, said other row is not selected, said memory bitline of said unselected row being useable as a conductor for coupling the average voltage to said associated sense amplifier.

10. The memory circuit of claim 9 further comprising a reference reset circuit for setting the state of said reference cells wherein the reference cells of each said reference cell pair are set to opposite data states.

11. The memory circuit of claim 10 wherein said reference reset circuit comprises means for alternating the data states of said reference cells.

12. The memory circuit of claim 11 wherein each said memory cell and each said reference cell comprises a single-transistor, single capacitor configuration having a ferroelectric capacitor connected between a drive line and said respective bitline by a select transistor, all said select transistors having identical dimensions and all said capacitors have identical dimensions.

13. The memory circuit of claim 12 wherein said reference reset circuit comprises a reset transistor associated with each said reference cell.

14. The memory circuit of claim 9 comprising two reference circuits associated with each said row pair wherein said two reference circuits are alternately selected upon a data transfer cycle.

15. The memory circuit of claim 9 comprising an open bitline configuration.

16. The memory circuit of claim 9 comprising a folded bitline configuration.

17. A ferroelectric memory circuit, comprising:

first and second ferroelectric memory cell arrays, each array comprising a plurality of rows of memory cells, each row connected to a respective memory bitline;

first and second reference circuit array, each array comprising at least one reference circuit, each reference circuit connected to a pair of reference bitlines, wherein when said first memory cell array is accessed, said first reference cell circuit array is also accessed, and when said second memory cell array is accessed, said second reference cell circuit is also accessed;

a sense amplifier connected to one memory bitline of said first memory cell array and connected to a corresponding memory bitline of said second memory cell array;

a sense capacitance associated with each said reference bitline; and means for short circuiting together said pair of reference bitlines to obtain an average of the voltages developed across said associated sense capacitances;

wherein when said first memory array is accessed, said corresponding memory bitline of said second memory array is used as a conductor for coupling the average voltage to said sense amplifier, and when said second memory array is accessed, said corresponding memory bitline of said first memory array is used a conductor for coupling the average voltage to said sense amplifier.

18. The memory circuit of claim 17 comprising an open bitline configuration.

19. The memory circuit of claim 17 comprising a folded bitline configuration.

20. The memory circuit of claim 17 wherein said reference cell arrays each comprise two reference circuits associated with each said row of memory cells.

21. A method for generating a reference voltage for a ferroelectric memory circuit having a memory cell array when operating in either DRAM mode or NVRAM mode, comprising the steps of:

storing opposite charges on a pair of ferroelectric capacitors wherein the respective charge on each said ferroelectric capacitor is opposite to the charge previously stored;

discharging the charge of each said ferroelectric capacitor into a respective sense capacitance wherein said sense capacitances are charged to a corresponding voltage; and deriving a reference voltage which is the average of the corresponding voltages of said sense capacitances.

22. A method for generating a reference voltage for a ferroelectric memory circuit operating in either DRAM mode or NVRAM mode, comprising the steps of:

storing opposite charges on a pair of ferroelectric capacitors;

discharging each said ferroelectric capacitor into a respective sense capacitance wherein said sense capacitances are charged to corresponding voltages representative of said charges; deriving a reference voltage which is the average of said corresponding voltages of said sense capacitances; and alternating the charges on said pair of ferroelectric capacitors wherein the charge on each said ferroelectric capacitor is opposite to the charge previously stored.

23. A method of operating a ferroelectric memory operating in either DRAM mode or NVRAM mode, comprising the steps of:

accessing a memory cell in a portion of a memory cell array wherein a memory voltage is developed on a memory bitline, said memory voltage being proportional to a charge stored in said memory cell;

transferring charges from first and second reference cells respectively to first and second reference bitlines wherein respective first and second voltages are developed which are proportional to said charges stored in said first and second reference cells, said charges representative of the state of said first and second reference cells;

averaging said first and second voltages wherein an averaged voltage is provided on a memory bitline in the portion of said memory cell array which is not being accessed; and sensing the voltages on said memory bitlines.

24. The method of claim 23 further comprising the step of resetting the charges on said first and second reference cells wherein the reset charge on each said reference cell is opposite to the initial charge thereon.

25. The method of claim 24 wherein said first reference cell comprises a first ferroelectric capacitor and said second reference cells comprises a second ferroelectric capacitor.

26. The method of claim 25 wherein said step of resetting comprises the step of providing polarization charges to said first and second ferroelectric capacitors whereby said first and second ferroelectric capacitors are polarized to opposite states when said ferroelectric memory is operating in NVRAM mode.

27. The method of claim 26 wherein said step of resetting comprises the step of providing bias charges to said first and second ferroelectric capacitors whereby said first and second ferroelectric capacitors are biased to opposite states when said ferroelectric memory is operating in DRAM mode.

* * * * *